United States Patent
Hasegawa et al.

(10) Patent No.: US 10,969,527 B2
(45) Date of Patent: Apr. 6, 2021

(54) POLARIZING PLATE WITH PHASE DIFFERENCE LAYERS, AND ORGANIC EL DISPLAY DEVICE

(71) Applicant: NITTO DENKO CORPORATION, Ibaraki (JP)

(72) Inventors: Yuki Hasegawa, Ibaraki (JP); Ayaka Umemoto, Ibaraki (JP); Kentarou Takeda, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 284 days.

(21) Appl. No.: 16/320,270

(22) PCT Filed: Jul. 21, 2017

(86) PCT No.: PCT/JP2017/026496
§ 371 (c)(1),
(2) Date: Jan. 24, 2019

(87) PCT Pub. No.: WO2018/021190
PCT Pub. Date: Feb. 1, 2018

(65) Prior Publication Data
US 2019/0235148 A1    Aug. 1, 2019

(30) Foreign Application Priority Data

Jul. 29, 2016    (JP) .............................. JP2016-149769

(51) Int. Cl.
*G02B 5/30*    (2006.01)
*H05B 33/02*    (2006.01)
(Continued)

(52) U.S. Cl.
CPC ............. *G02B 5/3083* (2013.01); *G02B 5/30* (2013.01); *G02B 5/3025* (2013.01); *G09F 9/30* (2013.01); *H01L 51/5281* (2013.01); *H05B 33/02* (2013.01)

(58) Field of Classification Search
CPC .. G02B 5/3025; G02B 5/3083; H01L 51/5281
(Continued)

(56) References Cited

U.S. PATENT DOCUMENTS 6,025,958 A    2/2000   Yamaoka et al.
6,136,225 A    10/2000  Meyer et al.
(Continued)

FOREIGN PATENT DOCUMENTS

CN    104635288 A    5/2015
CN    105717572 A    6/2016
(Continued)

OTHER PUBLICATIONS

Office Action dated Sep. 29, 2020, issued in counterpart JP Application No. 2016-149769, with English machine translation. (49 pages).
(Continued)

*Primary Examiner* — Ricky D Shafer
(74) *Attorney, Agent, or Firm* — Westerman, Hattori, Daniels & Adrian, LLP

(57) ABSTRACT

A polarizing plate with retardation layers of the present invention includes a polarizer, a first retardation layer, and a second retardation layer in the staled order. The polarizer and the lust retardation layer are bonded to each other via a first adhesive layer, the first retardation layer and the second retardation layer are bonded to each other via a second adhesive layer, the first retardation layer and the second retardation layer each have a thickness of 5 µm or less, and the second adhesive layer has an average refractive index of
(Continued)

1.55 or more, and a difference between the average refractive index of the second adhesive layer and an average refractive index of the first retardation layer, and a difference between the average refractive index of the second adhesive layer and an average refractive index of the second retardation layer are each less than 0.08.

11 Claims, 1 Drawing Sheet

(51) Int. Cl.
*G09F 9/30* (2006.01)
*H01L 51/52* (2006.01)

(58) Field of Classification Search
USPC ................................. 359/489.07, 489.15
See application file for complete search history.

(56) References Cited

U.S. PATENT DOCUMENTS

| | | |
|---|---|---|
| 6,773,766 B2 | 8/2004 | Meyer et al. |
| 7,387,857 B2 | 6/2008 | Oomori et al. |
| 7,708,906 B2 | 5/2010 | Oomori et al. |
| 9,279,993 B2 | 3/2016 | Mitobe et al. |
| 9,383,492 B2 | 7/2016 | Hatanaka et al. |
| 9,529,130 B2 | 12/2016 | Hatanaka et al. |
| 9,541,691 B2 | 1/2017 | Hatanaka et al. |
| 9,696,475 B2 | 7/2017 | Hatanaka et al. |
| 10,061,066 B2 | 8/2018 | Ueno et al. |
| 10,067,268 B2 | 9/2018 | Mita et al. |
| 10,088,705 B2 | 10/2018 | Miyai et al. |
| 10,094,954 B2 | 10/2018 | Xu et al. |
| 10,139,540 B2 | 11/2018 | Hatanaka et al. |
| 2003/0219548 A1 | 11/2003 | Meyer et al. |
| 2004/0066482 A1* | 4/2004 | Tanaka ............. G02F 1/133634 349/141 |
| 2006/0040071 A1 | 2/2006 | Oomori et al. |
| 2007/0056682 A1* | 3/2007 | Yamada ............. G02B 5/3083 156/249 |
| 2008/0003382 A1 | 1/2008 | Oomori et al. |
| 2013/0106675 A1 | 5/2013 | Mitobe et al. |
| 2013/0160938 A1* | 6/2013 | Yasui ................ B05D 5/10 156/246 |
| 2014/0168768 A1* | 6/2014 | Seo ................. G02B 5/3083 359/489.07 |
| 2015/0002010 A1* | 1/2015 | Lee ................. G02B 5/3025 313/112 |
| 2015/0042941 A1 | 2/2015 | Hatanaka et al. |
| 2015/0042942 A1 | 2/2015 | Hatanaka et al. |
| 2015/0042943 A1 | 2/2015 | Hatanaka et al. |
| 2015/0042944 A1 | 2/2015 | Hatanaka et al. |
| 2015/0043071 A1 | 2/2015 | Hatanaka et al. |
| 2015/0049291 A1 | 2/2015 | Hatanaka et al. |
| 2016/0025913 A1* | 1/2016 | Oh ................. G02B 5/3083 359/487.02 |
| 2016/0085102 A1* | 3/2016 | Ohmuro ............. G02B 5/305 349/61 |
| 2017/0031074 A1* | 2/2017 | Kong ................ G02B 5/3016 |
| 2017/0235023 A1 | 8/2017 | Mita et al. |
| 2017/0235024 A1 | 8/2017 | Xu et al. |
| 2017/0299779 A1 | 10/2017 | Mita et al. |
| 2017/0299790 A1 | 10/2017 | Ueno et al. |
| 2017/0299919 A1 | 10/2017 | Miyai et al. |
| 2017/0299920 A1 | 10/2017 | Mita et al. |
| 2019/0107657 A1* | 4/2019 | Jung ................ H01L 27/3244 |
| 2019/0331838 A1* | 10/2019 | Konno .............. G02F 1/13363 |

FOREIGN PATENT DOCUMENTS

| | | |
|---|---|---|
| JP | 11-149015 A | 6/1999 |
| JP | H11-513019 A | 11/1999 |
| JP | 2002-533742 A | 10/2002 |
| JP | 2004-102115 A | 4/2004 |
| JP | 2004-233872 A | 8/2004 |
| JP | 2006-056822 A | 3/2006 |
| JP | 2006-098460 A | 4/2006 |
| JP | 2009-276533 A | 11/2009 |
| JP | 2013-117714 A | 6/2013 |
| JP | 2015-007700 A | 1/2015 |
| JP | 2015-34851 A | 2/2015 |
| JP | 2015-111245 A | 6/2015 |
| JP | 2016-71372 A | 5/2016 |
| JP | 2016-118776 A | 6/2016 |
| TW | 201509683 A | 3/2015 |
| WO | 2011/142587 A2 | 11/2011 |
| WO | 2016/035636 A1 | 3/2016 |

OTHER PUBLICATIONS

English translation International Search Report dated Oct. 24, 2017, issued in counterpart International Application PCT/JP2017/026496. (2 pages).
Explanation of Circumstances Concerning Accelerated Examination dated Oct. 11, 2018, issued in counterpart JP Application No. 2016-149769, with English translation. (6 pages).
Office Action dated Jan. 9, 2019, issued in counterpart JP Application No. 2016-149769, with English translation. (13 pages).
Office Action dated Jul. 28, 2020, issued in counterpart JP application No. 2019-135197, with English translation. (8 pages).
Office Action dated Jul. 24, 2020, issued in counterpart CN application No. 201780047060.0, with English translation. (18 pages).
Office Action dated Mar. 22, 2019, issued in counterpart JP Application No. 2016-149769, with English translation (47 pages).
Murakoshi, Yutaka et al., "Adhesive for Optical Components", Journal of the Japan Society for Precision Engineering, vol. 79, No. 8, 2013, with English translation, pp. 735-738.
Office Action dated Dec. 7, 2020, issued in counterpart TW Application No. 106125057, with English Translation. (9 pages).

* cited by examiner

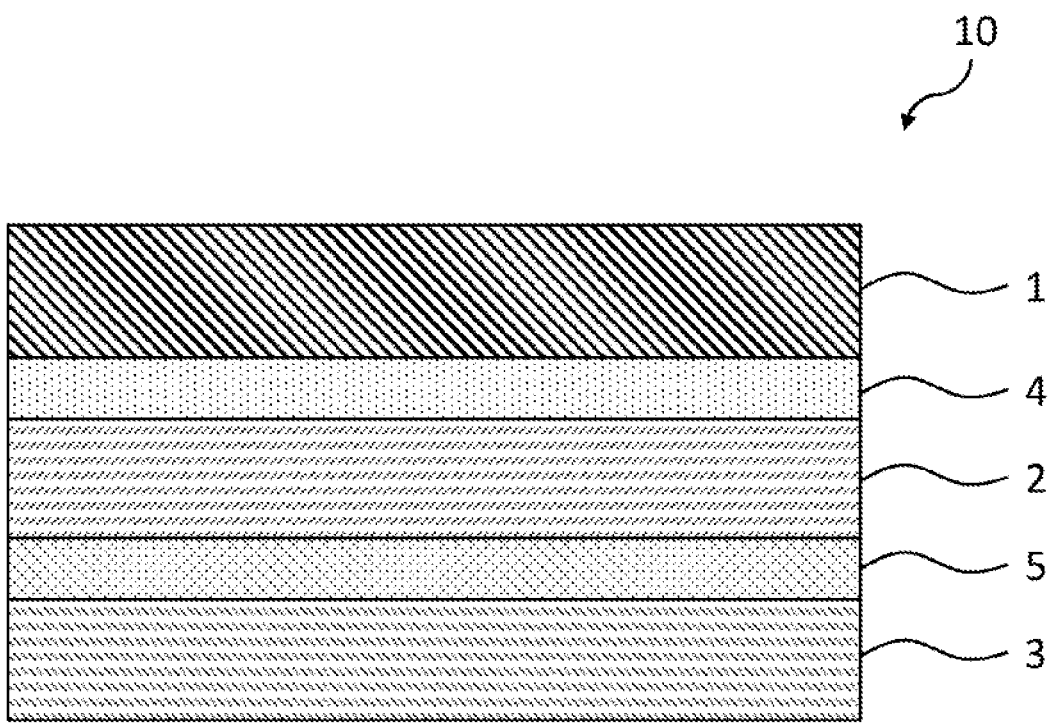

POLARIZING PLATE WITH PHASE DIFFERENCE LAYERS, AND ORGANIC EL DISPLAY DEVICE

TECHNICAL FIELD

The present invention relates to a polarizing plate with retardation layers and an organic EL display apparatus.

BACKGROUND ART

In order that poor visibility due to ambient light reflection or background reflection in the display screen of a display apparatus may be alleviated, a display apparatus in which a circularly polarizing plate is arranged on the viewer side of a display panel has been known. In each of Patent Literatures 1 and 2, there are proposals of a polarizing plate that has achieved an excellent reflection hue in an oblique direction through the reduction of the reflection of incident light from the oblique direction in black display, and a display apparatus including the polarizing plate.

CITATION LIST

Patent Literature

[PTL 1] JP 2015-111236 A
[PTL 2] JP 2015-210459 A

SUMMARY OF INVENTION

Technical Problem

However, the display apparatus using the polarizing plate described in each of Patent Literatures 1 and 2 involves a problem in that unevenness occurs in reflected light, and hence its visibility is insufficient.

The present invention has been made in view of the problem, and an object of the present invention is to provide a polarizing plate with retardation layers that can suppress the unevenness of reflected light to improve visibility, and an organic EL display apparatus including the polarizing plate with retardation layers.

Solution to Problem

A polarizing plate with retardation layers according to an embodiment of the present invention includes a polarizer, a first retardation layer, and a second retardation layer in the stated order. The polarizer and the first retardation layer are bonded to each other via a first adhesive layer, the first retardation layer and the second retardation layer are bonded to each other via a second adhesive layer, the first retardation layer and the second retardation layer each have a thickness of 5 µm or less, and the second adhesive layer has an average refractive index of 1.55 or more, and a difference between the average refractive index of the second adhesive layer and an average refractive index of the first retardation layer, and a difference between the average refractive index of the second adhesive layer and an average refractive index of the second retardation layer are each less than 0.08.

In one embodiment of the present invention, a difference between an average refractive index of the first adhesive layer and an average refractive index of the polarizer, and a difference between the average refractive index of the first adhesive layer and the average refractive index of the first retardation layer are each 0.06 or less.

In one embodiment of the present invention, the first adhesive layer and the second adhesive layer each have a thickness of 6 µm or less.

In one embodiment of the present invention, the first retardation layer and the second retardation layer each includes an alignment fixed layer of a liquid crystal compound.

In one embodiment of the present invention, the first retardation layer includes a $\lambda/2$ plate, and the second retardation layer includes a $\lambda/4$ plate.

In one embodiment of the present invention, the polarizer has a thickness of 12 µm or less.

In one embodiment of the present invention, a thickness from the polarizer to the second retardation layer is 35 µm or less.

According to another aspect of the present invention, there is provided an organic EL display apparatus. The organic EL display apparatus includes the polarizing plate with retardation layers as described above.

Advantageous Effects of Invention

According to the present invention, the polarizing plate with retardation layers that can suppress the unevenness of reflected light to improve visibility, and the organic EL display apparatus including the polarizing plate with retardation layers can be provided.

BRIEF DESCRIPTION OF DRAWINGS

FIG. 1 is a sectional view of a polarizing plate with retardation layers according to one embodiment of the present invention.

DESCRIPTION OF EMBODIMENTS

Embodiments of the present invention are described below, but the present invention is not limited to the embodiments.

(Definitions of Terms and Symbols)
The definitions of terms and symbols herein are as described below.
(1) Refractive Index ($n_x$, $n_y$, or $n_z$)
The symbol "$n_x$" represents a refractive index in a direction in which a refractive index in a plane becomes maximum (i.e., a slow axis direction), the symbol "$n_y$" represents a refractive index in the direction perpendicular to a slow axis in the plane (i.e., a fast axis direction), and the symbol "$n_z$" represents a refractive index in a thickness direction.
(2) In-plane Retardation (Re)
The symbol "Re ($\lambda$)" represents an in-plane retardation measured at 23° C. with light having a wavelength of $\lambda$ nm. When the thickness of a layer (film) is represented by d (nm), the Re($\lambda$) is determined from the equation "Re=($n_x$−$n_y$)×d". For example, the symbol "Re(550)" represents an in-plane retardation measured at 23° C. with light having a wavelength of 550 nm.
(3) Thickness Direction Retardation (Rth)
The symbol "Rth($\lambda$)" represents a thickness direction retardation measured at 23° C. with light having a wavelength of $\lambda$ nm. For example, the symbol "Rth(550)" represents a thickness direction retardation measured at 23° C. with light having a wavelength of 550 nm. When the thickness of a layer (film) is represented by d (nm), the Rth ($\lambda$) is determined from the equation "Rth=($n_x$−$n_z$)×d".

A. Polarizing Plate with Retardation Layers

FIG. 1 is a sectional view of a polarizing plate with retardation layers according to one embodiment of the present invention. A polarizing plate 10 with retardation layers includes a polarizer 1, a first retardation layer 2, and a second retardation layer 3 in the stated order.

The thickness of each of the first retardation layer 2 and the second retardation layer 3 is 5 µm or less. The first retardation layer 2 typically functions as a λ/2 plate, and the second retardation layer 3 typically functions as a λ/4 plate. The first retardation layer 2 has a slow axis. In one embodiment, an angle formed between the slow axis of the first retardation layer 2 and the absorption axis of the polarizer 1 is, for example, from 5° to 25°, preferably from 10° to 20°, more preferably from 10° to 17°, still more preferably about 15°. The second retardation layer 3 also has a slow axis. An angle formed between the slow axis of the second retardation layer 3 and the absorption axis of the polarizer 1 is, for example, from 60° to 90°, preferably from 65° to 85°, more preferably from 70° to 78°, still more preferably about 75°. An angle formed between the slow axis of the first retardation layer 2 and the slow axis of the second retardation layer 3 is, for example, from 50° to 70°, preferably from 52° to 65°, more preferably from 55° to 65°, still more preferably about 60°.

In another embodiment, the angle formed between the slow axis of the first retardation layer 2 and the absorption axis of the polarizer 1 is, for example, from −5° to −25°, preferably from −10° to −20°, more preferably from −10° to −17°, still more preferably about −15°. The second retardation layer 3 also has a slow axis. The angle formed between the slow axis of the second retardation layer 3 and the absorption axis of the polarizer 1 is, for example, from −60° to −90°, preferably from −65° to −85°, more preferably from −70° to −78°, still more preferably about −75°. The angle formed between the slow axis of the first retardation layer 2 and the slow axis of the second retardation layer 3 is, for example, from 50° to 70°, preferably from 52° to 65°, more preferably from 55° to 65°, still more preferably about 60°.

In still another embodiment, the angle formed between the slow axis of the first retardation layer 2 and the absorption axis of the polarizer 1 is, for example, from 60° to 90°, preferably from 65° to 85°, more preferably from 70° to 78°, still more preferably about 75°. The second retardation layer 3 also has a slow axis. The angle formed between the slow axis of the second retardation layer 3 and the absorption axis of the polarizer 1 is, for example, from 5° to 25°, preferably from 10° to 20°, more preferably from 10° to 17°, still more preferably about 15°. The angle formed between the slow axis of the first retardation layer 2 and the slow axis of the second retardation layer 3 is, for example, from 50° to 70°, preferably from 52° to 65°, more preferably from 55° to 65°, still more preferably about 60°.

In still another embodiment, the angle formed between the slow axis of the first retardation layer 2 and the absorption axis of the polarizer 1 is, for example, from −60° to −90°, preferably from −65° to −85°, more preferably from −70° to −78°, still more preferably about −75°. The second retardation layer 3 also has a slow axis. The angle formed between the slow axis of the second retardation layer 3 and the absorption axis of the polarizer 1 is, for example, from −5° to −25°, preferably from −10° to −20°, more preferably from −10° to −17°, still more preferably about −15°. The angle formed between the slow axis of the first retardation layer 2 and the slow axis of the second retardation layer 3 is, for example, from 50° to 70°, preferably from 52° to 65°, more preferably from 55° to 65°, still more preferably about 60°.

The polarizer 1 and the first retardation layer 2 are bonded to each other via a first adhesive layer 4, and the first retardation layer 2 and the second retardation layer 3 are bonded to each other via a second adhesive layer 5. The thickness of each of the first adhesive layer 4 and the second adhesive layer 5 is typically 6 µm or less. A difference between the average refractive index of the first adhesive layer 4 and the average refractive index of each of layers (the polarizer 1 and the first retardation layer 2) adjacent to the first adhesive layer 4 is typically less than 0.12. The difference between the average refractive index of the first adhesive layer 4 and the average refractive index of each of the adjacent layers is preferably less than 0.10, more preferably less than 0.08, still more preferably 0.06 or less. The average refractive index of the second adhesive layer 5 is 1.55 or more, and a difference between the average refractive index of the second adhesive layer 5 and the average refractive index of each of layers (the first retardation layer 2 and the second retardation layer 3) adjacent to the second adhesive layer 5 is less than 0.08. The difference between the average refractive index of the second adhesive layer 5 and the average refractive index of each of the adjacent layers is preferably 0.06 or less, more preferably 0.01 or less. The use of the polarizing plate 10 with retardation layers in a display apparatus can suppress the unevenness of the reflected light of the display apparatus to improve the visibility of the apparatus. The polarizing plate 10 with retardation layers may include a protective film (not shown) on the side of the polarizer 1 opposite to the first retardation layer 2.

The thickness of the polarizing plate 10 with retardation layers (the total thickness of the polarizer 1, the first adhesive layer 4, the first retardation layer 2, the second adhesive layer 5, and the second retardation layer 3) is preferably from 4 µm to 35 µm, more preferably from 6 µm to 20 µm.

B. Polarizer

Any appropriate polarizer may be adopted as the polarizer 1. For example, a resin film forming the polarizer may be a single-layer resin film, or may be a laminate of two or more layers.

Specific examples of the polarizer including the single-layer resin film include polyene-based alignment films, such as: a film obtained by subjecting a hydrophilic polymer film, such as a polyvinyl alcohol (PVA)-based film, a partially formalized PVA-based film, or an ethylene-vinyl acetate copolymer-based partially saponified film, to a dyeing treatment with a dichroic substance, such as iodine or a dichroic dye, and a stretching treatment; a dehydration-treated product of PVA; and a dehydrochlorination-treated product of polyvinyl chloride. A polarizer obtained by dyeing the PVA-based film with iodine and uniaxially stretching the dyed film is preferably used because of its excellent optical characteristics.

The dyeing with iodine is performed by, for example, immersing the PVA-based film in an aqueous solution of iodine. The stretching ratio of the uniaxial stretching is preferably from 3 times to 7 times. The stretching may be performed after the dyeing treatment, or may be performed while the dyeing is performed. In addition, the dyeing may be performed after the stretching. The PVA-based film is subjected to, for example, a swelling treatment, a cross-linking treatment, a washing treatment, or a drying treatment as required. For example, when the PVA-based film is immersed in water to be washed with the water before the dyeing, dirt and an antiblocking agent on the surface of the PVA-based film can be washed off. In addition, the PVA-based film can be swollen to prevent dyeing unevenness or the like.

The polarizer obtained by using the laminate is specifically, for example, a polarizer obtained by using a laminate of a resin substrate and a PVA-based resin layer (PVA-based resin film) laminated on the resin substrate, or a laminate of a resin substrate and a PVA-based resin layer applied and formed onto the resin substrate. The polarizer obtained by using the laminate of the resin substrate and the PVA-based resin layer applied and formed onto the resin substrate may be produced, for example, by: applying a PVA-based resin solution to the resin substrate, and drying the solution to form the PVA-based resin layer on the resin substrate, thereby providing the laminate of the resin substrate and the PVA-based resin layer; and stretching and dyeing the laminate to turn the PVA-based resin layer into the polarizer. In this embodiment, the stretching typically includes stretching the laminate while immersing the laminate in an aqueous solution of boric acid. Further, the stretching may further include subjecting the laminate to in-air stretching at high temperature (e.g., 95° C. or more) before the stretching in the aqueous solution of boric acid as required. The resultant laminate of the resin substrate and the polarizer may be used as it is (i.e., the resin substrate may be used as a protective layer for the polarizer), or a product obtained as follows may be used: the resin substrate is peeled from the laminate of the resin substrate and the polarizer, and any appropriate protective layer in accordance with purposes is laminated on the peeled surface. Details about such polarizer production method are described in, for example, JP 2012-73580 A, which is incorporated herein by reference in its entirety.

The thickness of the polarizer 1 is preferably 12 μm or less, more preferably from 1 μm to 10 μm, still more preferably from 3 μm to 8 μm, particularly preferably from 3 μm to 5 μm. When the thickness of the polarizer 1 falls within such range, the entirety of the polarizing plate 10 with retardation layers can be thinned. Such thin polarizer 1 as described above can be produced by using the laminate of the resin substrate and the PVA-based resin layer applied and formed onto the resin substrate.

The polarizer 1 preferably shows absorption dichroism at any wavelength in the wavelength range of from 380 nm to 780 nm. The single layer transmittance of the polarizer is preferably from 42.0% to 46.0%, more preferably from 44.5% to 46.0%. The polarization degree of the polarizer is preferably 97.0% or more, more preferably 99.0% or more, still more preferably 99.9% or more.

The average refractive index of the polarizer 1 is preferably from 1.48 to 1.65, and is typically 1.55. When the average refractive index of the polarizer 1 takes a value in the range, the difference between the average refractive index of the polarizer 1 and the average refractive index of the first adhesive layer 4 can be easily adjusted.

C. First Retardation Layer and Second Retardation Layer

As described above, in one embodiment of the present invention, the first retardation layer 2 can function as a λ/2 plate, and the second retardation layer 3 can function as a λ/4 plate. When the first retardation layer 2 functions as a λ/2 plate, with regard to wavelength dispersion characteristics after its lamination with the second retardation layer 3 functioning as a λ/4 plate (in particular, a wavelength range in which the retardation of the second retardation layer 3 deviates from λ/4), the retardation can be appropriately regulated, and hence a circular polarization function can be exhibited in a wide wavelength range.

The in-plane retardation Re(550) of such first retardation layer 2 is from 180 nm to 320 nm, preferably from 200 nm to 300 nm, more preferably from 200 nm to 280 nm. The first retardation layer 2 typically has a refractive index ellipsoid of nx>ny=nz or nz=nx>ny. In addition, the in-plane retardation Re(550) of such second retardation layer 3 is from 80 nm to 180 nm, preferably from 90 nm to 170 nm, more preferably from 100 nm to 150 nm. The second retardation layer 3 typically has a refractive index ellipsoid of nx>ny=nz or nz=nx>ny.

The average refractive index of the first retardation layer 2 is preferably from 1.50 to 1.70, and is typically 1.59 or 1.60. When the average refractive index of the first retardation layer 2 takes a value in the range, the difference between the average refractive index of the first retardation layer 2 and the average refractive index of the first adhesive layer 4 and/or the second adhesive layer 5 can be set to less than 0.12 (preferably 0.06 or less). The thickness of the first retardation layer 2 is preferably from 1 μm to 5 μm, more preferably from 1 μm to 3 μm, particularly preferably 2 μm.

The average refractive index of the second retardation layer 3 is preferably from 1.50 to 1.70, and is typically 1.59 or 1.60. When the average refractive index of the second retardation layer 3 takes a value in the range, the difference between the average refractive index of the second retardation layer 3 and the average refractive index of the second adhesive layer 5 can be set to less than 0.08. The thickness of the second retardation layer 3 is preferably from 1 μm to 5 μm, more preferably from 1 μm to 3 μm, particularly preferably 1 μm.

In one embodiment, the first retardation layer 2 and/or the second retardation layer 3 may be an alignment fixed layer of a liquid crystal compound. When the liquid crystal compound is used, a difference between the nx and ny of the first retardation layer 2 and/or the second retardation layer 3 to be obtained can be made much larger than that of a non-liquid crystal material, and hence the thickness of the first retardation layer and/or the second retardation layer for obtaining a desired in-plane retardation can be significantly reduced. As a result, further thinning of the polarizing plate 10 with retardation layers (finally, an organic EL display apparatus) can be achieved. The term "alignment fixed layer" as used herein refers to such a layer that the liquid crystal compound is aligned in a predetermined direction in the layer, and its alignment state is fixed.

In one embodiment, a rod-like liquid crystal compound is typically aligned under a state in which its molecules are arranged in the slow axis direction of the first retardation layer 2 (second retardation layer 3) (homogeneous alignment). The liquid crystal compound is, for example, a liquid crystal compound whose liquid crystal phase is a nematic phase (nematic liquid crystal). For example, a liquid crystal polymer or a liquid crystal monomer may be used as the liquid crystal compound. The mechanism via which the liquid crystal compound expresses its liquid crystallinity may be any one of a lyotropic mechanism and a thermotropic mechanism. The liquid crystal polymer and the liquid crystal monomer may be used alone or in combination thereof. Any appropriate liquid crystal monomer may be adopted as the liquid crystal monomer. For example, polymerizable mesogen compounds described in JP 2002-533742 A (WO 00/37585 A1), EP 358208 (U.S. Pat. No. 5,211,877), EP 66137 (U.S. Pat. No. 4,388,453), WO 93/22397 A1, EP 0261712, DE 19504224, DE 4408171, and GB 2280445 may be used. Specific examples of such polymerizable mesogen compounds include a product available under the product name "LC242" from BASF SE, a product available under the product name "E7" from Merck KGaA, and a product available under the product name "LC-Silicon-CC3767" from Wacker Chemie AG. The liquid crystal monomer is preferably, for example, a nematic liquid crystal monomer. Details about specific examples of the liquid crystal compound and a method of forming the alignment fixed layer are described in JP 2006-163343 A, which is incorporated herein by reference.

In another embodiment, a disc-like liquid crystal compound is typically aligned, under any one of the following states: vertical alignment, hybrid alignment, and tilt alignment. The liquid crystal compound is, for example, a discotic liquid crystalline compound. In the discotic liquid crystalline compound, the disc surface of the discotic liquid crystalline compound is typically aligned in a substantially vertical manner to the film plane of the first retardation layer (second retardation layer). The phrase "the discotic liquid crystalline compound is aligned in a substantially vertical manner" means that the average of angles formed between the film plane and the disc surface of the discotic liquid crystalline compound falls within the range of from 70° to 90°. The average more preferably falls within the range of from 80° to 90°, and still more preferably falls within the range of from 85° to 90°. A compound described in, for example, JP 2007-108732 A or JP 2010-244038 A may be preferably used as the discotic liquid crystalline compound, but the discotic liquid crystalline compound is not limited thereto.

D. First Adhesive Layer

As described above, the difference between the average refractive index of the first adhesive layer 4 and the average refractive index of each of the layers adjacent to the first adhesive layer 4 is less than 0.12. When a thin polarizing plate with retardation layers whose retardation layers each have a small thickness (of, for example, 5 μm or less) is used in a display apparatus, owing to a difference in refractive index between the respective layers forming the polarizing plate with retardation layers, the thickness unevenness, irregularities, and the like of each of the layers may be viewed as interference unevenness. In contrast, when the difference between the average refractive index of the first adhesive layer 4 and the average refractive index, of each of the layers adjacent to the first adhesive layer 4 is less than 0.12, the interference unevenness can be suppressed, and as a result, the visibility of the apparatus can be improved.

The average refractive index of the first adhesive layer 4 is preferably from 1.52 to 1.64, more preferably from 1.55 to 1.64. The thickness of the first adhesive layer 4 is preferably from 10 nm to 6 μm, more preferably from 200 nm to 2 μm.

An adhesive that may form the first adhesive layer 4 preferably has transparency and optical isotropy. An active energy ray-curable adhesive may be typically used as the adhesive. A radically curable adhesive, a cationically curable adhesive, an anionically curable adhesive, or the like may be selected as the active energy ray-curable adhesive as required, and two or more of the adhesives maybe appropriately used in combination; for example, a hybrid adhesive of the radically curable adhesive and the cationically curable adhesive may be used. The radically curable adhesive is, for example, an adhesive containing, as a curable component, a compound (e.g., a monomer and/or an oligomer) having a radically polymerizable group, such as a (meth)acrylate group or a (meth)acrylamide group. The term "(meth)acryl" refers to acryl and/or methacryl.

An active energy ray-curable adhesive having desired characteristics (e.g., a refractive index after its curing) can be obtained as the active energy ray-curable adhesive by adjusting the kinds, combination, and compounding ratios of a double bond-containing monomer and/or oligomer, a cross-linking agent, and the like. Examples of a component that can adjust the refractive index after the curing include a compound having an aromatic ring, a compound having a halogen atom, and a compound having a sulfur atom, and inorganic particles each made of titania, zirconia, or the like. Examples of the compound having an aromatic ring include compounds each having a naphthalene skeleton, a phenoxybenzyl skeleton, a fluorene skeleton, or a 9-vinylcarbazole skeleton. In addition, the adhesive may contain a compound containing a (meth)acryloyl group as a diluent component, an acrylic oligomer as a plasticizer, and a radical photopolymerization initiator as a photopolymerization initiator.

E. Second Adhesive Layer

The second adhesive layer 5 may include any appropriate adhesive. As described above, the difference between the average refractive index of the second adhesive layer 5 and the average refractive index of each of the layers adjacent to the second adhesive layer 5 is less than 0.08. Thus, the above-mentioned interference unevenness can be suppressed, and as a result, the visibility can be improved.

The average refractive index of the second adhesive layer 5 is 1.55 or more, preferably from 1.55 to 1.64, more preferably from 1.55 to 1.63. The thickness of the second adhesive layer 5 is preferably from 10 nm to 6 μm, more preferably from 200 nm to 2 μm. The adhesive that may form the second adhesive layer 5 is identical to the adhesive described for the first adhesive layer 4 in the section D.

F. Protective Film

The protective film is formed of any appropriate film that can be used as a protective film for the polarizer 1. Specific examples of a material serving as a main component for the film include: cellulose-based resins, such as triacetylcellulose (TAC); and transparent resins, such as polyester-based, polyvinyl alcohol-based, polycarbonate-based, polyamide-based, polyimide-based, polyether sulfone-based, polysulfone-based, polystyrene-based, polynorbornene-based, polyolefin-based, (meth)acrylic, and acetate-based resins. In addition, the specific examples also include (meth)acrylic, urethane-based, (meth)acrylic urethane-based, epoxy-based, and silicone-based thermosetting resins or UV-curable resins. In addition to the foregoing, the specific examples also include glassy polymers, such as a siloxane-based polymer. In addition, a polymer film described in JP 2001-343529 A (WO 01/37007 A1) may be used. For example, a resin composition containing a thermoplastic resin having a substituted or unsubstituted imide group in a side chain thereof, and a thermoplastic resin having a substituted or unsubstituted phenyl group and a nitrile group in side chains thereof may be used as a material for the film, and the composition is, for example, a resin composition having an alternating copolymer formed of isobutene and N-methylmaleimide, and an acrylonitrile-styrene copolymer. The polymer film may be, for example, an extrusion-molded product of the resin composition.

The glass transition temperature (Tg) of the (meth)acrylic resin is preferably 115° C. or more, more preferably 120° C. or more, still more preferably 125° C. or more, particularly preferably 130° C. or more. This is because the resin can be excellent in durability. Although the upper limit value of the Tg of the (meth)acrylic resin is not particularly limited, the Tg is preferably 170° C. or less from the viewpoint of, for example, the formability of the resin.

Any appropriate (meth)acrylic resin may be adopted as the (meth)acrylic resin to the extent that the effects of the present invention are not impaired. Examples thereof include: poly(meth)acrylates, such as polymethyl methacrylate; a methyl methacrylate-(meth)acrylic acid copolymer; a methyl methacrylate-(meth)acrylate copolymer; a methyl methacrylate-acrylate-(meth)acrylic acid copolymer; a methyl (meth)acrylate-styrene copolymer (e.g., a MS resin); and a polymer having an alicyclic hydrocarbon group (e.g., a methyl methacrylate-cyclohexyl methacrylate copolymer or a methyl methacrylate-norbornyl (meth)acrylate copolymer). The resin is preferably, for example, a polyalkyl (meth)acrylate having an alkyl group having 1 to 6 carbon atoms, such as polymethyl (meth)acrylate. The resin is more preferably, for example, a methyl methacrylate-based resin containing methyl methacrylate as a main component (at from 50 wt % to 100 wt %, preferably from 70 wt % to 100 wt %).

Specific examples of the (meth)acrylic resin include: ACRYPET VH and ACRYPET VRL20A manufactured by Mitsubishi Rayon Co., Ltd.; a (meth)acrylic resin having a ring structure in a molecule thereof, the resin being described in JP 2004-70296 A; and a high-Tg (meth)acrylic resin obtained by intramolecular cross-linking or an intramolecular cyclization reaction.

A (meth)acrylic resin having a lactone ring structure is particularly preferred as the (meth)acrylic resin because the resin has high heat resistance, high transparency, and high mechanical strength. Examples of the (meth)acrylic resin having a lactone ring structure include (meth)acrylic resins each having a lactone ring structure, the resins being described in JP 2000-230016 A, JP 2001-151814 A, JP 2002-120326 A, JP 2002-254544 A, and JP 2005-146084 A.

The mass-average molecular weight (sometimes referred to as "weight-average molecular weight") of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, most preferably 140° C. or more. This is because the resin can be excellent in durability. Although the upper limit value of the Tg of the (meth)acrylic resin having a lactone ring structure is not particularly limited, the Tg is preferably 170° C. or less from the viewpoint of, for example, the formability of the resin. The term "(meth)acrylic" as used herein refers to acrylic and/or methacrylic.

The polarizing plate 10 with retardation layers of the present invention is typically arranged on the viewer side of an image display apparatus, and the protective film is typically arranged on the viewer side. Therefore, the protective film may be subjected to a surface treatment, such as a hard coat treatment, an antireflection treatment, an antisticking treatment, or an antiglare treatment, as required.

Any appropriate thickness may be adopted as the thickness of the protective film as long as the effects of the present invention are obtained. The thickness of the protective film is, for example, from 10 μm to 100 μm, preferably from 12 μm to 90 μm. When the surface treatment is performed, the thickness of the protective film is a thickness including the thickness of the surface-treated layer.

G. Display Apparatus

The polarizing plate with retardation layers described in the section A to the section F is applicable to display apparatus, such as a liquid crystal display apparatus and an organic EL display apparatus. Therefore, the present invention includes a display apparatus using the polarizing plate with retardation layers. A display apparatus according to an embodiment of the present invention includes a display element and the polarizing plate with retardation layers described in the section A to the section F, the polarizing plate being arranged on the viewer side of the display element. The polarizing plate with retardation layers is arranged so that the second retardation layer 3 may be on a display element side.

EXAMPLES

The present invention is specifically described below by way of Examples, but the present invention is not limited to these Examples. Methods of measuring respective characteristics are as described below.

1. Measurement of Refractive Index of Polarizer

A refractive index in a direction perpendicular to an absorption axis and a refractive index in an absorption axis direction out of the in-plane refractive indices of a polarizer, and the refractive index thereof in a thickness direction were measured with Prism Coupler SPA-4000 (manufactured by Sairon Technology, Inc.), and the average of the refractive indices was defined as the average refractive index of the polarizer. A measurement temperature was set to 23° C., and a measurement wavelength was set to 532 nm.

2. Measurement of Refractive Index of Retardation Layer

A refractive index in a direction perpendicular to a slow axis and a refractive index in a slow axis direction out of the in-plane refractive indices of a retardation film, and the refractive index thereof in a thickness direction were measured with Prism Coupler SPA-4000 (manufactured by Sairon Technology, Inc.), and the average of the refractive indices was defined as the average refractive index of a retardation layer. A measurement temperature was set to 23° C., and a measurement wavelength was set to 532 nm.

3. Measurement of Refractive Index of Adhesive Layer

The in-plane refractive index of a cured product of an adhesive forming an adhesive layer, and the refractive index thereof in a thickness direction were each measured with Prism Coupler SPA-4000 (manufactured by Sairon Technology, Inc.), and the average of the refractive indices was defined as the average refractive index of the adhesive layer. A measurement temperature was set to 23° C., and a measurement wavelength was set to 532 nm.

4. Measurement of Retardation of Retardation Layer

Measurement was performed with AxoScan (manufactured by Axometrics, Inc.). A measurement temperature was set to 23° C., and a measurement wavelength was set to 550 nm.

(Production of Polarizer)

An amorphous polyethylene terephthalate (A-PET) film (manufactured by Mitsubishi Plastics, Inc., product name "NOVACLEAR", thickness: 100 μm) was used as a resin substrate. An aqueous solution of a polyvinyl alcohol (PVA) resin (manufactured by The Nippon Synthetic Chemical Industry Co., Ltd., product name "GOHSENOL (trademark) NH-26") was applied to one surface of the resin substrate, and was dried at 60° C. to forma PVA-based resin layer having a thickness of 7 μm. A laminate thus obtained was immersed in an insolubilizing bath having a liquid temperature of 30° C. (an aqueous solution of boric acid obtained by compounding 100 parts by weight of water with 4 parts by weight of boric acid) for 30 seconds (insolubilizing step). Next, the laminate was immersed in a dyeing bath having a liquid temperature of 30° C. (an aqueous solution of iodine obtained by compounding 100 parts by weight of water with 0.2 part by weight of iodine and 2 parts by weight of potassium iodide) for 60 seconds (dyeing step). Next, the laminate was immersed in a cross-linking bath having a liquid temperature of 30° C. (an aqueous solution of boric acid obtained by compounding 100 parts by weight of water with 3 parts by weight of potassium iodide and 3 parts by weight of boric acid) for 30 seconds (cross-linking step). After that, the laminate was uniaxially stretched between rolls having different peripheral speeds in a longitudinal direction (lengthwise direct ion) while being immersed in an aqueous solution of boric acid having a liquid temperature of 60° C. (an aqueous solution obtained by compounding 100 parts by weight of water with 4 parts by weight of boric acid and 5 parts by weight of potassium iodide) (step B). The time period for which the laminate was immersed in the aqueous solution of boric acid was 120 seconds, and the laminate was stretched until a time point immediately before its rupture. After that, the laminate was immersed in a washing bath (an aqueous solution obtained by compounding 100 parts by weight of water with 3 parts by weight of potassium iodide), and was then dried with warm air at 60° C. (washing and drying step). Thus, a laminate in which a polarizer having a thickness of 5 μm was formed on the resin substrate was obtained. Next, the resin substrate was peeled from the polarizer, and an acrylic transparent protective film described in JP 2012-3269 A was bonded as a protective film to one surface of the polarizer. Thus, a polarizer with a protective film was obtained. The polarizer with a protective film was subjected to a corona treatment before its use.

(Production of Retardation Film forming Retardation Layer)

(Retardation Film A)

An application liquid containing a rod-like and polymerizable nematic liquid crystal monomer was applied to a transparent resin substrate for λ/2 alignment whose alignment film had been subjected to a rubbing treatment, and the liquid was solidified under a state in which its refractive index anisotropy was retained. Thus, a retardation film A having a thickness of 2 μm was produced on the transparent resin substrate. A refractive index in a fast axis direction and a refractive index in a slow axis direction out of the in-plane refractive indices of the retardation film A were 1.55 and 1.68, respectively, and the refractive index thereof in a thickness direction was 1.55, and hence the average refractive index of the refractive indices was 1.59. The in-plane retardation Re(550) of the retardation film A was 260 nm. The resultant retardation film was subjected to a corona treatment before its use.

(Retardation Film B)

An application liquid containing a rod-like and polymerizable nematic liquid crystal monomer was applied to a transparent resin substrate for λ/4 alignment whose alignment film had been subjected to a rubbing treatment, and the liquid was solidified under a state in which its refractive index anisotropy was retained. Thus, a retardation film B having a thickness of 1 μm was produced on the transparent resin substrate. A refractive index in a fast axis direction and a refractive index in a slow axis direction out of the in-plane refractive indices of the retardation film B were 1.55 and 1.68, respectively, and the refractive index thereof in a thickness direction was 1.55, and hence the average refractive index of the refractive indices was 1.59. The in-plane retardation Re(550) of the retardation film B was 120 nm. The resultant retardation film was subjected to a corona treatment before its use.

(Retardation Film C)

A transparent resin substrate formed of cellulose acylate was subjected to an alkali saponification treatment. Next, a λ/2 alignment treatment was performed by applying an alignment film application liquid to the surface of the cellulose acylate subjected to the alkali saponification treatment, and drying the liquid. Next, an application liquid containing a discotic liquid crystalline compound was applied to the alignment-treated surface of the transparent resin substrate, and heating and UV irradiation were performed to fix the alignment of the liquid crystalline compound. Thus, a retardation film C having a thickness of 2 μm was produced on the transparent resin substrate. A refractive index in a fast axis direction and a refractive index in a slow axis direction out of the in-plane refractive indices of the retardation film C were 1.53 and 1.64, respectively, and the refractive index thereof in a thickness direction was 1.64, and hence the average refractive index of the refractive indices was 1.60. The in-plane retardation Re(550) of the retardation film C was 246 nm. The resultant retardation film was subjected to a corona treatment before its use.

(Retardation Film D)

A transparent resin substrate formed of cellulose acylate was subjected to an alkali saponification treatment. Next, a λ/4 alignment treatment was performed by applying an alignment film application liquid to the surface of the cellulose acylate subjected to the alkali saponification treatment, and drying the liquid. Next, an application liquid containing a discotic liquid crystalline compound was applied to the alignment-treated surface of the transparent resin substrate, and heating and UV irradiation were performed to fix the alignment of the liquid crystal compound. Thus, a retardation film D having a thickness of 1 μm was produced on the transparent resin substrate. A refractive index in a fast axis direction and a refractive index in a slow axis direction out of the in-plane refractive indices of the retardation film D were 1.53 and 1.64, respectively, and the refractive index thereof in a thickness direction was 1.64, and hence the average refractive index of the refractive indices was 1.60. The in-plane retardation Re (550) of the retardation film D was 123 nm. The resultant retardation film was subjected to a corona treatment before its use.

(Production of Adhesive forming Adhesive Layer)

(Adhesive A)

50 Parts of PLACCEL FA1DDM (manufactured by Daicel Corporation), 40 parts of acryloylmorpholine (ACMO: trademark) (manufactured by Kohjin Co., Ltd.), 10 parts of ARUFON UP-1190 (manufactured by Toagosei Co., Ltd.), 3 parts of a photopolymerization initiator (product name "KAYACURE DETX-S", manufactured by Nippon Kayaku Co., Ltd.), and 3 parts of IRGACURE 907 (manufactured by BASF Japan Ltd.) were mixed to prepare an adhesive A. The in-plane refractive index of a cured product obtained by photocuring the resultant adhesive A (300 mJ/cm$^2$) was 1.52, and the refractive index thereof in a thickness direction was 1.52, and hence the average refractive index of the refractive indices was 1.52.

(Adhesive B)

40 Parts of LIGHT ACRYLATE POB-A (manufactured by Kyoeisha Chemical Co., Ltd.), 10 parts of PLACCEL FA1DDM (manufactured by Daicel Corporation), 40 parts of acryloylmorpholine (ACMO: trademark) (manufactured by Kohjin Co., Ltd.), 10 parts of ARUFON UP-1190 (manufactured by Toagosei Co., Ltd.), 3 parts of a photopolymerization initiator (product name "KAYACURE DETX-S", manufactured by Nippon Kayaku Co., Ltd.), and 3 parts of IRGACURE 907 (manufactured by BASF Japan Ltd.) were mixed to prepare an adhesive B. The in-plane refractive index of a cured product obtained by photocuring the resultant adhesive B (300 mJ/cm2) was 1.55, and the refractive index thereof in a thickness direction was 1.55, and hence the average refractive index of the refractive indices was 1.55.

(Adhesive C)

70 Parts of OGSOLEA-F5710 (manufactured by Osaka Gas Chemicals Co., Ltd.), 10 parts of PLACCEL FA1DDM (manufactured by Daicel Corporation), 18 parts of acryloylmorpholine (ACMO: trademark) (manufactured by Kohjin Co., Ltd.), 5 parts of ARUFON UP-1190 (manufactured by Toagosei Co., Ltd.), and 3 parts of a photopolymerization initiator (product name "DAROCUR 1173", manufactured by BASF Japan Ltd.) were mixed to prepare an adhesive C. The in-plane refractive index of a cured product obtained by photocuring the resultant adhesive C (300 mJ/cm$^2$) was 1.60, and the refractive index thereof in a thickness direction was 1.60, and hence the average refractive index of the refractive indices was 1.60.

(Adhesive D)

35 Parts of 9-vinylcarbazole (manufactured by Tokyo Chemical Industry Co., Ltd.), 40 parts of OGSOL EA-F5710 (manufactured by Osaka Gas Chemicals Co., Ltd.), 20 parts of acryloylmorpholine (ACMO: trademark) (manufactured by Kohjin Co., Ltd.), 5 parts of ARUFOK UP-1190 (manufactured by Toagosei Co., Ltd.), and 3 parts of a photopolymerization initiator (product name "DAROCUR 1173", manufactured by BASF Japan Ltd.) were mixed to prepare an adhesive D. The in-plane refractive index of a cured product obtained by photocuring the resultant adhesive D (300 mJ/cm$^2$) was 1.64, and the refractive index thereof in a thickness direction was 1.64, and hence the average refractive index of the refractive indices was 1.64.

Example 1

The adhesive A forming a first adhesive layer was applied to the polarizer, and the retardation film A forming a first retardation layer was transferred from the transparent resin substrate onto a surface having applied thereto the adhesive A so that, an angle formed between the absorption axis of the polarizer and the slow axis of the retardation film A became 15°, followed by UV irradiation (300 mJ/cm$^2$) to cure the adhesive A. Next, the adhesive B forming a second adhesive layer was applied to the surface of the retardation film A opposite to the polarizer, and the retardation film D forming a second retardation layer was transferred from the transparent resin substrate onto the surface having applied thereto the adhesive B so that an angle formed between the absorption axis of the polarizer and the slow axis of the retardation film D became 75°, and an angle formed between the slow axis of the retardation film A and the slow axis of the retardation film D became 60°, followed by UV irradiation (300 mJ/cm$^2$) to cure the adhesive B. Thus, a polarizing plate with retardation layers was obtained. The thickness of the cured adhesive A (first adhesive layer) was 1 µm, and the thickness of the cured adhesive B (second adhesive layer) was 1 µm.

Example 2

A polarizing plate with retardation layers was produced in the same manner as in Example 1 except that the adhesive B was used as an adhesive forming the first adhesive layer.

Example 3

A polarizing plate with retardation layers was produced in the same manner as in Example 2 except that the adhesive C was used as an adhesive forming the second adhesive layer.

Example 4

A polarizing plate with retardation layers was produced, in the same manner as in Example 1 except that: the adhesive C was used as an adhesive forming the first adhesive layer; and the adhesive D was used as an adhesive forming the second adhesive layer.

Example 5

The adhesive B forming a first adhesive layer was applied to the polarizer, and the retardation film C forming a first retardation layer was transferred from the transparent resin substrate onto a surface having applied thereto the adhesive B so that an angle formed between the absorption axis of the polarizer and the slow axis of the retardation film C became 75°, followed by UV irradiation (300 mJ/cm$^2$) to cure the adhesive B. Next, the adhesive B forming a second adhesive layer was applied to the surface of the retardation film C opposite to the polarizer, and the retardation film B forming a second retardation layer was transferred from the transparent resin substrate onto the surface having applied thereto the adhesive B so that an angle formed between the absorption axis of the polarizer and the slow axis of the retardation film B became 15°, and an angle formed between the slow axis of the retardation film C and the slow axis of the retardation film B became 60°, followed by UV irradiation (300 mJ/cm$^2$) to cure the adhesive B. Thus, a polarizing plate with retardation layers was obtained. The thickness of the cured adhesive B (first adhesive layer) was 1 µm, and the thickness of the cured adhesive B (second adhesive layer) was 1 µm.

Example 6

A polarizing plate with retardation layers was produced in the same manner as in Example 2 except that: the retardation film C was used as a retardation film forming the first retardation layer; and the retardation film D was used as a retardation film forming the second retardation layer.

Example 7

A polarizing plate with retardation layers was produced in the same manner as in Example 2 except that the retardation film B was used as a retardation film forming the second retardation layer.

Comparative Example 1

A polarizing plate with retardation layers was produced in the same manner as in Example 1 except that the adhesive A was used as an adhesive forming the second adhesive layer.

Comparative Example 2

A polarizing plate was produced in the same manner as in Comparative Example 1 except that the adhesive B was used as an adhesive forming the first adhesive layer.

(Evaluation)

The polarizing plate with retardation layers of each of Examples and Comparative Examples was bonded to a reflective plate via an acrylic pressure-sensitive adhesive, and the external appearance of the resultant was visually observed under a three-wavelength tube. The results of evaluations based on the following criteria are shown in Table 1.

No unevenness was viewed. . . . ⓞ
Substantially no unevenness was viewed (no problem occurred in practical use). . . . o
Unevenness was viewed. . . . x

TABLE 1

|  | Example 1 | Example 2 | Example 3 | Example 4 | Example 5 | Example 6 | Example 7 | Comparative Example 1 | Comparative Example 2 |
|---|---|---|---|---|---|---|---|---|---|
| Average refractive index (a) of polarizer | 1.55 | 1.55 | 1.55 | 1.55 | 1.55 | 1.55 | 1.55 | 1.55 | 1.55 |
| Average refractive index (b) of first adhesive layer | 1.52 | 1.55 | 1.55 | 1.60 | 1.55 | 1.55 | 1.55 | 1.52 | 1.55 |
| Average refractive index (c) of first retardation layer | 1.59 | 1.59 | 1.59 | 1.59 | 1.60 | 1.60 | 1.59 | 1.59 | 1.59 |
| Average refractive index (d) of second adhesive layer | 1.55 | 1.55 | 1.60 | 1.64 | 1.55 | 1.55 | 1.55 | 1.52 | 1.52 |
| Average refractive index (e) of second retardation layer | 1.60 | 1.60 | 1.60 | 1.60 | 1.59 | 1.60 | 1.59 | 1.60 | 1.60 |
| [a-b] | 0.03 | 0 | 0 | 0.05 | 0 | 0 | 0 | 0.03 | 0 |
| [b-c] | 0.07 | 0.04 | 0.04 | 0.01 | 0.05 | 0.05 | 0.04 | 0.07 | 0.04 |
| [c-d] | 0.04 | 0.04 | 0.01 | 0.05 | 0.05 | 0.05 | 0.04 | 0.07 | 0.07 |
| [d-e] | 0.05 | 0.05 | 0 | 0.04 | 0.04 | 0.05 | 0.04 | 0.08 | 0.08 |
| Result of evaluation of unevenness | ○ | ○ | ⓞ | ○ | ○ | ○ | ○ | X | X |

INDUSTRIAL APPLICABILITY

The polarizing plate with retardation layers of the present invention is suitably used in, for example, an image display apparatus. Specifically, the polarizing plate is suitably used as an antireflection plate for, for example, a liquid crystal panel for a liquid crystal television, a liquid crystal display, a cellular phone, a digital camera, a video camera, a portable game machine, a car navigation, a copying machine, a printer, a facsimile, a watch, or a microwave oven, or an organic EL device.

REFERENCE SIGNS LIST

1 polarizer
2 first retardation layer
3 second retardation layer
4 first adhesive layer
5 second adhesive layer
10 polarizing plate with retardation layers

The invention claimed is:

1. A polarizing plate with retardation layers, comprising a polarizer, a first retardation layer, and a second retardation layer in the stated order,
   wherein the polarizer and the first retardation layer are bonded to each other via a first adhesive layer,
   wherein the first retardation layer and the second retardation layer are bonded to each other via a second adhesive layer,
   wherein the first retardation layer and the second retardation layer each have a thickness of 5 μm or less, and
   wherein the second adhesive layer has an average refractive index of 1.55 or more, and a difference between the average refractive index of the second adhesive layer and an average refractive index of the first retardation layer, and a difference between the average refractive index of the second adhesive layer and an average refractive index of the second retardation layer are each less than 0.08.

2. The polarizing plate with retardation layers according to claim 1, wherein a difference between an average refractive index of the first adhesive layer and an average refractive index of the polarizer, and a difference between the average refractive index of the first adhesive layer and the average refractive index of the first retardation layer are each 0.06 or less.

3. The polarizing plate with retardation layers according to claim 1, wherein, the first adhesive layer and the second adhesive layer each have a thickness of 6 μm or less.

4. The polarizing plate with retardation layers according to claim 1, wherein the first retardation layer and the second retardation layer each comprise an alignment fixed layer of a liquid crystal compound.

5. The polarizing plate with retardation layers according to claim 1, wherein the first retardation layer comprises a λ/2 plate, and the second retardation layer comprises a λ/4 plate.

6. The polarizing plate with retardation layers according to claim 1, wherein the polarizer has a thickness of 12 μm or less.

7. The polarizing plate with retardation layers according to claim 1, wherein a thickness from the polarizer to the second retardation layer is 35 μm or less.

8. An organic EL display apparatus, comprising the polarizing plate with retardation layers of claim 1.

9. A polarizing plate with retardation layers, comprising a polarizer, a first retardation layer, and a second retardation layer in the stated order,
   wherein the polarizer and the first retardation layer are bonded to each other via a first adhesive layer,
   wherein the first retardation layer and the second retardation layer are bonded to each other via a second adhesive layer,
   wherein the polarizer has a thickness of 12 μm or less, wherein the first retardation layer and the second retardation layer each have a thickness of 5 μm or less, and each comprise an alignment fixed layer of a liquid crystal compound, wherein the first retardation layer comprises a λ/2 plate, and the second retardation layer comprises a λ/4 plate, wherein the first adhesive layer and the second adhesive layer each have a thickness of 6 μm or less, and wherein the second adhesive layer has an average refractive index of 1.55 or more, and a difference between the average refractive index of the second adhesive layer and an average refractive index of the first retardation layer, and a difference between the average refractive index of the second adhesive layer and an average refractive index of the second retardation layer are each less than 0.08.

10. The polarizing plate with retardation layers according to claim 9, wherein a thickness from the polarizer to the second retardation layer is 35 μm or less.

11. An organic EL display apparatus, comprising the polarizing plate with retardation layers of claim 9.

* * * * *